United States Patent
Lv et al.

(10) Patent No.: US 10,608,177 B2
(45) Date of Patent: Mar. 31, 2020

(54) SELF-GATED RRAM CELL AND METHOD FOR MANUFACTURING THE SAME

(71) Applicant: Institute of Microelectronics, Chinese Academy of Sciences, Beijing (CN)

(72) Inventors: Hangbing Lv, Beijing (CN); Ming Liu, Beijing (CN); Qi Liu, Beijing (CN); Shibing Long, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 15/525,200

(22) PCT Filed: Dec. 26, 2014

(86) PCT No.: PCT/CN2014/095080
§ 371 (c)(1),
(2) Date: May 8, 2017

(87) PCT Pub. No.: WO2016/101246
PCT Pub. Date: Jun. 30, 2016

(65) Prior Publication Data
US 2017/0331034 A1    Nov. 16, 2017

(51) Int. Cl.
*H01L 27/24*    (2006.01)
*H01L 45/00*    (2006.01)

(52) U.S. Cl.
CPC .......... *H01L 45/1253* (2013.01); *H01L 27/24* (2013.01); *H01L 27/249* (2013.01);
(Continued)

(58) Field of Classification Search
CPC ... H01L 45/1253; H01L 27/24; H01L 45/142; H01L 45/143; H01L 45/144; H01L 45/146; H01L 45/1608
(Continued)

(56) References Cited

U.S. PATENT DOCUMENTS

| | | | |
|---|---|---|---|
| 2009/0221146 A1* | 9/2009 | Seko | H01L 45/1233 438/694 |
| 2010/0226163 A1* | 9/2010 | Savransky | G11C 13/0004 365/148 |

(Continued)

FOREIGN PATENT DOCUMENTS

| | | |
|---|---|---|
| CN | 101840995 A | 9/2010 |
| CN | 102522501 A | 6/2012 |

(Continued)

OTHER PUBLICATIONS

"International Application No. PCT/CN2014/095080, International Search Report dated Aug. 14, 2015", (Aug. 14, 2015), 2 pgs.

(Continued)

*Primary Examiner* — Didarul A Mazumder
(74) *Attorney, Agent, or Firm* — Schwegman Lundberg & Woessner, P.A.

(57) ABSTRACT

The present disclosure discloses a self-gated RRAM cell and a manufacturing method thereof; which belong to the field of microelectronic technology. The self-gated RRAM cell comprises: a stacked structure containing multiple layers of conductive lower electrodes; a vertical trench formed by etching the stacked structure; a $M_8XY_6$ gated layer formed on an inner wall and a bottom of the vertical trench; a resistance transition layer formed on a surface of the $M_8XY_6$ gated layer; and a conductive upper electrode formed on a surface of the resistance transition layer, the vertical trench being filled with the conductive upper electrode. The present disclosure is implemented on a basis of using the self-gated RRAM as a memory cell. It may not depend on a gated transistor and a diode, but relies on a non-linear variation characteristic of resistance of its own varied with voltage to achieve a self-gated function, which has a simple structure, easy integration, high density and low cost, capable of suppressing a reading crosstalk phenom- (Continued)

enon in a cross array structure; and is also adapted for a planar stacked cross array structure and a vertical cross array structure, achieving 3D storage with a high density.

12 Claims, 4 Drawing Sheets

(52) U.S. Cl.
CPC ........ *H01L 45/144* (2013.01); *H01L 45/1608* (2013.01); *H01L 45/04* (2013.01); *H01L 45/12* (2013.01); *H01L 45/1226* (2013.01); *H01L 45/14* (2013.01); *H01L 45/142* (2013.01); *H01L 45/143* (2013.01); *H01L 45/146* (2013.01); *H01L 45/147* (2013.01)

(58) Field of Classification Search
USPC .................. 257/49; 438/96, 97, 482, 488
See application file for complete search history.

(56) References Cited

U.S. PATENT DOCUMENTS

| | | | |
|---|---|---|---|
| 2011/0177666 A1* | 7/2011 | Nozawa | H01L 27/101 438/382 |
| 2011/0227023 A1 | 9/2011 | Bethune et al. | |
| 2012/0161094 A1* | 6/2012 | Huo | H01L 27/249 257/4 |
| 2013/0105756 A1* | 5/2013 | Kim | H01L 45/06 257/2 |
| 2014/0268995 A1* | 9/2014 | Joo | H01L 45/06 365/148 |
| 2015/0085559 A1* | 3/2015 | Lee | G11C 13/0007 365/148 |
| 2015/0103582 A1* | 4/2015 | Okawa | H01L 27/249 365/148 |
| 2015/0255512 A1* | 9/2015 | Takagi | H01L 45/146 257/4 |

FOREIGN PATENT DOCUMENTS

| | | |
|---|---|---|
| CN | 103390629 A | 11/2013 |
| CN | 103633242 A | 3/2014 |
| CN | 103733337 A | 4/2014 |
| CN | 103872245 A | 6/2014 |
| CN | 103892245 A | 7/2014 |

OTHER PUBLICATIONS

"International Application No. PCT/CN2014/095080, Written Opinion dated Aug. 14, 2015", (Aug. 14, 2015), 3 pgs.
"Chinese Application No. 201410830010.8 Office Action dated Sep. 13, 2016", w/English Translation, 19 pgs.
"Chinese Application No. 201410830010.8 Office Action dated Mar. 22, 2017", w/English Translation, 17 pgs.
"Chinese Application Serial No. 201410830010.8 Office Action dated Jul. 14, 2017", w/No English Translation, 7 pgs.

* cited by examiner

SELF-GATED RRAM CELL AND METHOD FOR MANUFACTURING THE SAME

TECHNICAL FIELD

The present disclosure relates to a self-gated non-volatile RRAM (Resistive Random Access Memory) cell adapted for a vertical cross array structure, and a method for manufacturing thereof, which belong to the field of microelectronic technology.

BACKGROUND

The RRAM is a MIM (Metal/Insulator/Metal) capacitor structure, which allows the device to be converted reversibly between a HRS (High Resistance State) and a LRS (Low Resistance State) by applying an electrical signal, so as to achieve data storage function. Because of excellent characteristics of the RRAM in terms of cell area, 3D (Three-Dimensional) integration, low power consumption, high erasure speed and multi-value storage, the RRAM has drawn high attention both at home and abroad.

Figure 1:
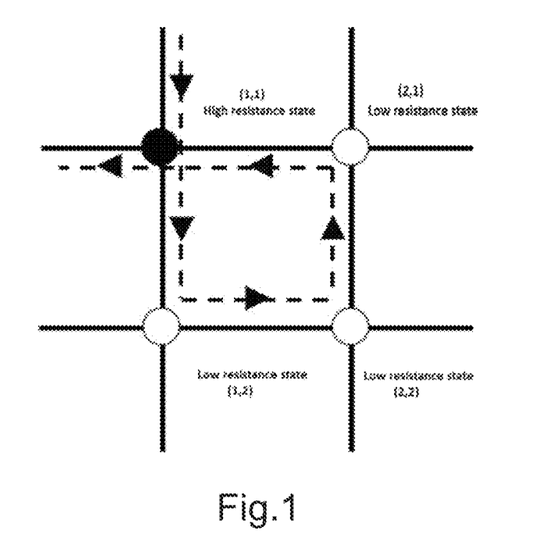
FIG. 1 is a schematic diagram of a cross array reading crosstalk phenomenon in a single-R structure.

Array frameworks of the RRAM may be divided into a passive cross array and an active array. In the passive cross array, each memory cell is defined by an upper electrode and a lower electrode consisting of word lines and bit lines intersected with each other, and the smallest memory cell area $4F^2$, where F is a feature size, can be achieved in a planar structure. The passive cross array may be multi-layer stacked to achieve a 3D storage structure, since it does not depend on a front end process of a semiconductor process. An effective cell area of each memory cell is only $4F^2/N$, where N is a number of stacked layers. However, a low resistance state of the RRAM in the passive cross array framework shows an ohmic conduction characteristic, and is prone to generate a crosstalk effect when a resistance value of an adjacent intersection point is read. Taking a 2×2 cross array shown in FIG. 1 as an example, if three adjacent intersection points, (1,2), (2,2) and (2,1), are in the low resistance state, a resistance read from the point (1,1) is always low resistance, no matter whether an actual resistance at the point (1,1) is in a high resistance state or the low resistance state. When a storage array becomes larger or multi-layer arrays are stacked, electricity leakage phenomenon will be more severe. In order to solve a misreading phenomenon caused by the crosstalk problem, a typical solution is to serially connect a diode or a non-linear resistor having rectification characteristics to the resistive device.

There are mainly two 3D integration approaches of the RRAM. One is a cross array multi-layer stacked structure, i.e., being formed by repeatedly preparing a 2D cross array structure and stacking multiple layers of the 2D cross array structures: and the other is the vertical cross array structure, i.e., rotating the conventional horizontal cross array structure by 90° and repeatedly extending in a horizontal direction to form a vertical 3D array structure.

The multi-layer stacked structure requires that each of layers of cross array structure is prepared respectively, which significantly improves production cost while a storage density per unit area is increased. Taking an N-layer stacked cross array as an example, it is typically produced by (2N+1) times of photolithograph, the photolithograph step accounting for about 30% of a total semiconductor production cost. However, the vertical 3D array structure only requires N+1 times of photolithograph, whose process cost is greatly reduced as compared to the multi-layer stacked structure.

Figure 2:
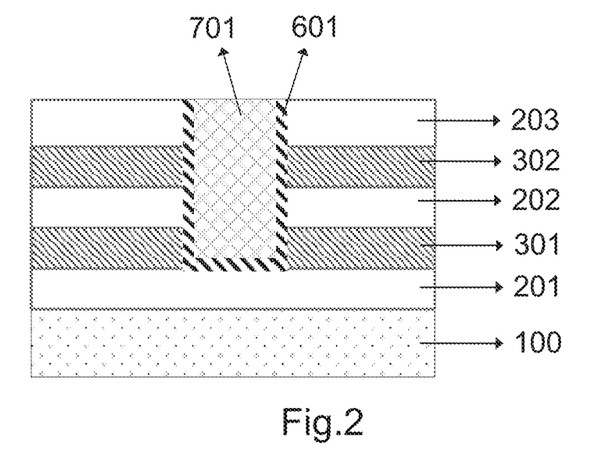
FIG. 2 is a schematic diagram of a conventional RRAM vertical cross array integration.

For the multi-layer stacked structures, integration of a gated tube and a resistive unit may be implemented more conveniently by a planar process; while for the vertical cross array structure, the integration of the gated tube is very difficult. That is because, in the vertical array, the upper electrode of each column of the resistive units is formed by a trench filling process, and due to lacking of a patterning process on a single device, it is very difficult to integrate one gated tube on each of the resistive units. Currently, worldwide reports about the vertical cross array 3D structure are almost entirely based on a single R structure, as shown in FIG. 2, which will be greatly restricted in terms of its integration scale and read and write operations in the absence of the gated tube.

SUMMARY

I. Technical Problem to be Solved

In view of the foregoing, a main object of the present disclosure is to provide a self-gated non-volatile RRAM cell adapted for a vertical cross array structure, and a method for manufacturing thereof, in order to eliminate misreading and crosstalk phenomenon in the vertical cross array of the RRAM.

II. Technical Solution

For this purpose, the present disclosure provides a self-gated Resistive Random Access Memory 'RRAM' cell, comprising: a stacked structure containing multiple layers of conductive lower electrodes; a vertical trench formed by etching the stacked structure; a $M_8XY_6$ gated layer formed on an inner wall and a bottom of the vertical trench; a resistance transition layer formed on a surface of the $M_8XY_6$ gated layer; and a conductive upper electrode formed on a surface of the resistance transition layer, the vertical trench being filled with the conductive upper electrode.

In the above technical solution, in the stacked structure containing the multiple layers of conductive lower electrodes, the conductive lower electrodes are used as word lines in a vertical cross array structure, any two layers of conductive lower electrodes is isolated by an insulating dielectric layer, a top layer of conductive lower electrode is covered by an insulating dielectric layer, and a bottom layer of conductive lower electrode is isolated from a substrate by an insulating dielectric layer.

In the above technical solution, the conductive lower electrode is made of any of conductive materials selected from a group consisting of metal material W, Al, Cu, Au, Ag, Pt, Ru, Ti, Ta, Pb, Co, Mo, Ir or Ni and metal compound TiN, TaN, $IrO_2$, CuTe, $Cu_3Ge$, ITO or IZO, or is alloy made of any two or more conductive materials selected from a group consisting of metal material W, Al, Cu, Au, Ag, Pt, Ru, Ti, Ta, Pb, Co, Mo, Ir or Ni and metal compound TiN, TaN, $IrO_2$, CuTe, $Cu_3Ge$, ITO or IZO; and the conductive lower electrode is formed with a thickness of 1 nm-500 nm by electron beam evaporation, chemical vapor deposition, pulse laser deposition, atomic layer deposition, or deposition by magnetron sputtering.

In the above technical solution, the insulating dielectric layer is made of SiN, SiO, SiON, $SiO_2$ doped with C, $SiO_2$ doped with P or $SiO_2$ doped with F; and the insulating dielectric layer is formed with a thickness of 10 nm-100 nm by chemical vapor deposition or sputtering.

In the above technical solution, the stacked structure is constituted by two layers of conductive lower electrodes which are a first conductive lower electrode 301 and a second conductive lower electrode 302, the second conductive lower electrode 302 being formed on the first conductive lower electrode 301, and the first conductive lower electrode 301 being isolated from the second conductive lower electrode 302 by a second insulating dielectric layer 202, the second conductive lower electrode 302 being covered by a third insulating dielectric layer 203, and the first conductive lower electrode 301 being isolated from the substrate by a first insulating dielectric layer 201.

In the above technical solution, the vertical trench goes through the insulating dielectric layer covering the multiple layers of conductive lower electrodes, the multiple layers of conductive lower electrodes and the insulating dielectric layers sandwiched between the multiple layers of conductive lower electrodes sequentially, and the bottom of the vertical trench is formed within the insulating dielectric layer under the bottom layer of conductive lower electrode.

In the above technical solution, for the $M_8XY_6$ gated layer formed on the inner wall and the bottom of the vertical trench, M is any of Cu, Ag, Li, Ni or Zn, X is any of Ge, Si, Sn, C or N, and Y is any of Se, S, O or Te. The $M_8XY_6$, gated layer formed on the inner wall and the bottom of the vertical trench is further made of doped $M_8XY_6$ material, doping element(s) being one or more of N, P, Zn, Cu, Ag, Li, Ni, Zn, Ge, Si, Sn, C, N, Se, S, O, Te, Br, Cl, F or I.

In the above technical solution, the $M_8XY_6$ gated layer formed on the inner wall and the bottom of the vertical trench is formed with a thickness of 1 nm-500 nm by electron beam evaporation, chemical vapor deposition, pulse laser deposition, atomic layer deposition, or deposition by magnetron sputtering.

In the above technical solution, the resistance transition layer formed on the surface of the $M_8XY_6$ gated layer is made of any of inorganic material CuS, AgS, AgGeSe, $CuI_xS_y$, $ZrO_2$, $HfO_2$, $TiO_2$, $SiO_2$, $WO_x$, NiO, $CuO_x$, ZnO, $TaO_x$, CoO, $Y_2O_3$, Si, PCMO, SZO or STO, or is made of any of organic material TCNQ, PEDOT, $P_3HT$ or PCTBT, or is made of a material formed by the inorganic material or the organic material being doped and characteristic modified; and the resistance transition layer is formed with a thickness of 1 nm-500 nm by electron beam evaporation, chemical vapor deposition, pulse laser deposition, atomic layer deposition, spin coating, or deposition by magnetron sputtering.

In the above technical solution, the conductive upper electrode formed within the vertical trench whose inner wall is covered by the $M_8XY_6$ gated layer and the resistance transition layer, an upper surface of the conductive upper electrode being flush with an upper surface of the insulating dielectric layer covering a top layer of conductive lower electrode.

In the above technical solution, the conductive upper electrode is made of any of conductive materials selected from metal material W, Al, Cu, Au, Ag, Pt, Ru, Ti, Ta, Co, Mo, Ir or Ni and metal compound TiN, TaN, $IrO_2$, CuTe, $Cu_3Ge$, ITO or IZO, or is alloy made of any two or more conductive materials selected from metal material W, Al, Cu, Au, Ag, Pt, Ru, Ti, Ta, Pb, Co, Mo, Ir or Ni and metal compound TiN, TaN, $IrO_2$, CuTe, $Cu_3Ge$, ITO or IZO; and the conductive upper electrode is formed with a thickness of 1 nm-500 nm by electron beam evaporation, chemical vapor deposition, pulse laser deposition, atomic layer deposition, or deposition by magnetron sputtering.

For this purpose, the present disclosure further provides manufacturing method of a self-gated Resistive Random Access Memory 'RRAM' cell, comprising: forming a stacked structure containing multiple layers of conductive lower electrodes; etching the stacked structure to form a vertical trench; forming a $M_8XY_6$ gated layer on an inner wall and a bottom of the vertical trench; forming a resistance transition layer on a surface of the $M_8XY_6$ gated layer; and forming a conductive upper electrode on a surface of the resistance transition layer, and filling the vertical trench with the conductive upper electrode.

In the above technical solution, the step of forming the stacked structure containing the multiple layers of conductive lower electrodes comprises: sequentially forming an insulating dielectric layer on a substrate, forming a conductive lower electrode on the insulating dielectric layer, forming another insulating dielectric layer on the conductive lower electrode, forming another conductive lower electrode on the other insulating dielectric layer, and so on, so that the insulating dielectric layers and the conductive lower electrodes are formed alternately, and the stacked structure containing the multiple layers of the conductive lower electrodes is finally formed after an insulating dielectric layer is formed on a top layer of conductive lower electrode.

In the above technical solution, the conductive lower electrode is formed by electron beam evaporation, chemical vapor deposition, pulse laser deposition, atomic layer deposition, or deposition by magnetron sputtering; and the insulating dielectric layer is formed by chemical vapor deposition or sputtering.

In the above technical solution, the step of etching the stacked structure to form the vertical trench comprises: etching, using a photolithograph and etching method, the stacked structure through the insulating dielectric layer covering the multiple layers of conductive lower electrodes, the multiple layers of conductive lower electrodes, and the insulating dielectric layers sandwiched between the multiple layers of conductive lower electrodes, the etching being stopped in the insulating dielectric layer under a bottom layer of conductive lower electrode.

In the above technical solution, the photolithograph is conventional photolithograph, electron beam exposure, or nanoimprint; and the etching is dry etching or wet etching, which uses a single-step etching process to form the trench in one step, or uses a multi-step etching process to etch the insulating dielectric layers and the conductive lower electrodes separately.

In the above technical solution, the step of forming the $M_8XY_6$ gated layer on the inner wall and the bottom of the vertical trench comprises: forming the $M_8XY_6$ gated layer on the inner wall and the bottom of the vertical trench by electron beam evaporation, chemical vapor deposition, pulse laser deposition, atomic layer deposition, or deposition by magnetron sputtering.

In the above technical solution, the step of forming the resistance transition layer on the surface of the $M_8XY_6$ gated layer comprises: forming the resistance transition layer on the surface of the $M_8XY_6$ gated layer by electron beam evaporation, chemical vapor deposition, pulse laser deposition, atomic layer deposition, spin coating, or deposition by magnetron sputtering.

In the above technical solution, the step of forming the conductive upper electrode on the surface of the resistance transition layer comprises: forming the conductive upper electrode within the vertical trench whose inner wall is covered by the $M_8XY_6$ gated layer and the resistance transition layer, by electron beam evaporation, chemical vapor deposition, pulse laser deposition, atomic layer deposition, or deposition by magnetron sputtering.

In the above technical solution, the step of forming the conductive upper electrode on the surface of the resistance transition layer further comprises: planarizing the conductive upper electrode, the resistance transition layer and the $M_8XY_6$ gated layer to form bit lines of a vertical cross array structure, thereby forming a self-gated RRAM cell.

In the above technical solution, the step of planarizing comprises: performing a planarization process on the conductive upper electrode, the resistance transition layer and the $M_8XY_6$ gated layer by a chemical mechanical polishing method, completely removing materials of horizontal parts of the conductive upper electrode, the resistance transition layer and the $M_8XY_6$ gated layer to complete patterning of the bit lines.

III. Beneficial Effects

As seen from the above technical solutions, the present disclosure has beneficial effects as follows.

1. The present disclosure utilizes a threshold transition characteristic of the $M_8XY_6$ gated layer, whose resistance shows a highly non-linear characteristic varied with voltage, and the resistance transition layer being serially connected with the $M_8XY_6$ gated layer causes the LRS of the resistance transition device to show a non-linear characteristic, so as to achieve its self-gated function in the cross array structure.

2. By making the $M_8XY_6$ gated layer and the resistance transition layer be adjacent to each other directly without a conductive layer therebetween, the present disclosure may prevent connection of gates of the adjacent units, which may eliminate the misreading and crosstalk phenomenon in the vertical cross array of the RRAM, so as to be applicable to the vertical cross array structure.

3. The self-gated RRAM unit provided by the present disclosure comprises the upper electrode, the lower electrode, the resistive material layer and the gated layer, the LRS of which shows the highly non-linear characteristic. The present disclosure is implemented on a basis of using the self-gated RRAM as a memory cell. It may not depend on a gated transistor and a diode, but relies on the non-linear variation characteristic of the resistance of its own varied with voltage to achieve a self-gated function, which has a simple structure, easy integration, high density and low cost, capable of suppressing a reading crosstalk phenomenon in a cross array structure. The non-linear resistive unit proposed by the present disclosure is also adapted for the planar stacked cross array structure and the vertical cross array structure, achieving 3D storage with a high density.

In summary, the present disclosure provides a self-gated non-volatile RRAM cell adapted for the vertical cross array integration and a manufacturing method thereof.

DETAILED DESCRIPTION

Hereinafter, the present disclosure will be described more completely in the embodiments with reference to the accompanying drawings. However, the present disclosure should not be construed as being limited to the embodiments set forth herein. In the drawings, thicknesses of layers and areas are enlarged for clarity, but as a schematic diagram, they should not be regarded as strictly reflecting proportional relationships of their geometric sizes. The drawings are schematic diagrams of ideal embodiments of the present disclosure. The embodiments of the present disclosure should not be considered to be limited to particular shapes of the areas as shown in the drawings, but should include the resulting shapes. The drawings are only illustrative, but should not be construed as limiting the scope of the present disclosure.

A self-gated RRAM cell provided by the present disclosure comprises: a stacked structure containing multiple layers of conductive lower electrodes; a vertical trench formed by etching the stacked structure; a $M_8XY_6$ gated layer formed on an inner wall and a bottom of the vertical trench; a resistance transition layer formed on a surface of the $M_8XY_6$ gated layer; and a conductive upper electrode formed on a surface of the resistance transition layer, the vertical trench being filled with the conductive upper electrode.

In the stacked structure containing the multiple layers of conductive lower electrodes, the conductive lower electrodes are used as word lines in a vertical cross array structure, any two layers of conductive lower electrodes being isolated by an insulating dielectric layer, a top layer of conductive lower electrode being covered by an insulating dielectric layer, and a bottom layer of conductive lower electrode being isolated from a substrate by an insulating dielectric layer.

Figure 3:
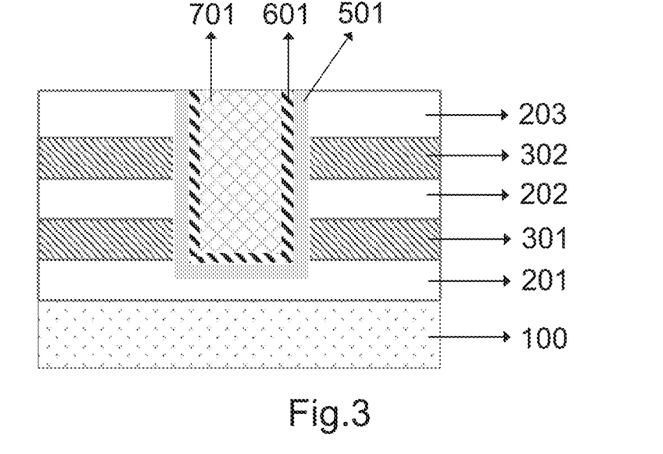
FIG. 3 is a schematic structure diagram of a self-gated RRAM cell according to an embodiment of the present disclosure.

As a preferred scheme, FIG. 3 shows a schematic structure diagram of a self-gated RRAM cell according to an embodiment of the present disclosure. The present embodiment uses a stacked structure with two layers of conductive lower electrodes, i.e., a stacked structure consisting of a first conductive lower electrode 301 and a second conductive lower electrode 302. However, the number of the stacked layers is not limited by the present embodiment.

As shown in FIG. 3, the RRAM cell comprises the first conductive lower electrode 301, the second conductive lower electrode 302, a $M_8XY_6$ gated layer 501, a resistance transition layer 601 and a conductive upper electrode 701, wherein the second conductive lower electrode 302 is formed on the first conductive lower electrode 301, and the first conductive lower electrode 301 is isolated from the second conductive lower electrode 302 by a second insulating dielectric layer 202, the second conductive lower electrode 302 is covered by a third insulating dielectric layer 203; and the $M_8XY_6$ gated layer 501 is formed on an inner wall of the vertical trench which is formed by etching the first conductive lower electrode 301 and the second conductive lower electrode 302, the vertical trench going through the third insulating dielectric layer 203 covering the second conductive lower electrode 302, the second conductive lower electrode 302, the second insulating dielectric layer 202 sandwiched between the first conductive lower electrode 301 and the second conductive lower electrode 302, and the first conductive lower electrode 301 sequentially, and a bottom of the vertical trench being formed within the first insulating dielectric layer 201 under the first conductive lower electrode 301. The resistance transition layer 601 is formed on a surface of the $M_8XY_6$ gated layer 501 which covers the inner wall of the vertical trench; the conductive upper electrode 701 is formed within the vertical trench whose inner wall is covered by the $M_8XY_6$ gated layer 501 and the resistance transition layer 601, an upper surface of the conductive upper electrode 701 being flush with an upper surface of the third insulating dielectric layer 203 which covers the second conductive lower electrode 302.

The conductive lower electrodes, e.g., the first conductive lower electrode 301 and the second conductive lower electrode 302 as shown in FIG. 3, may be made of any of conductive materials selected from metal material W, Al, Cu, Au, Ag, Pt, Ru, Ti, Ta, Pb, Co, Mo, Ir or Ni and metal compound TiN, TaN, IrO$_2$, CuTe, Cu$_3$Ge, ITO or IZO, or may be alloy made of any two or more conductive materials selected from metal material W, Al, Cu, Au, Ag, Pt, Ru, Ti, Ta, Pb, Co, Mo, Ir or Ni and metal compound TiN, TaN, IrO$_2$, CuTe, Cu$_3$Ge, ITO or IZO. The conductive lower electrodes may each be formed with a thickness of 1 nm-500 nm by electron beam evaporation, chemical vapor deposition, pulse laser deposition, atomic layer deposition, or deposition by magnetron sputtering.

The insulating dielectric layers, e.g., the first to third insulating dielectric layers 201, 202 and 203, may be made of SiN, SiO, SiON, SiO$_2$ doped with C, SiO$_2$ doped with P or SiO$_2$ doped with F. The insulating dielectric layers may each be formed with a thickness of 10 nm-100 nm by chemical vapor deposition or sputtering.

In the M$_8$XY$_6$ gated layer 501, M is any of Cu, Ag, Li, Ni or Zn, X is any of Ge, Si, Sn, C or N, and Y is any of Se, S, O or Te. The M$_8$XY$_6$ gated layer 501 may further be made of doped M$_8$XY$_6$ material, doping element(s) being one or more of N, P, Zn, Cu, Ag, Li, Ni, Zn, Ge, Si, Sn, C, N, Se, S, O, Te, Br, Cl, F or I. The M$_8$XY$_6$ gated layer 501 may be formed with a thickness of 1 nm-500 nm by electron beam evaporation, chemical vapor deposition, pulse laser deposition, atomic layer deposition, or deposition by magnetron sputtering.

The resistance transition layer 601 may be made of any of inorganic material CuS, AgS, AgGeSe, CuI$_x$S$_y$, ZrO$_2$, HfO$_2$, TiO$_2$, SiO$_2$, WO$_x$, NiO, CuO$_x$, ZnO, TaO$_x$, CoO, Y$_2$O$_3$, Si, PCMO, SZO or STO, or made of any of organic material TCNQ, PEDOT, P$_3$HT or PCTBT, or made of a material formed by the inorganic material or the organic material being doped and characteristic modified. The resistance transition layer 601 may be formed with a thickness of 1 nm-500 nm by electron beam evaporation, chemical vapor deposition, pulse laser deposition, atomic layer deposition, spin coating, or deposition by magnetron sputtering.

The conductive upper electrode 701 is formed within the vertical trench whose inner wall is covered by the M$_8$XY$_6$ gated layer 501 and the resistance transition layer 601, an upper surface of the conductive upper electrode 701 being flush with an upper surface of the insulating dielectric layer (e.g., the third insulating dielectric layer 203 as shown in FIG. 3) which covers a top layer of conductive lower electrode. The conductive upper electrode 701 may be made of any of conductive materials selected from metal material W, Al, Cu, Au, Ag, Pt, Ru, Ti, Ta, Pb, Co, Mo, Ir or Ni and metal compound TiN, TaN, IrO$_2$, CuTe, Cu$_3$Ge, ITO or IZO, or may be alloy made of any two or more conductive materials selected from metal material W, Al, Cu, Au, Ag, Pt, Ru, Ti, Ta, Pb, Co, Mo, Ir or Ni and metal compound TiN, TaN, IrO$_2$, CuTe, Cu$_3$Ge, ITO or IZO. The conductive upper electrode 701 may be formed by electron beam evaporation, chemical vapor deposition, pulse laser deposition, atomic layer deposition, or deposition by magnetron sputtering. A thickness of the conductive upper electrode 701 is 1 nm-500 nm.

Figure 4:
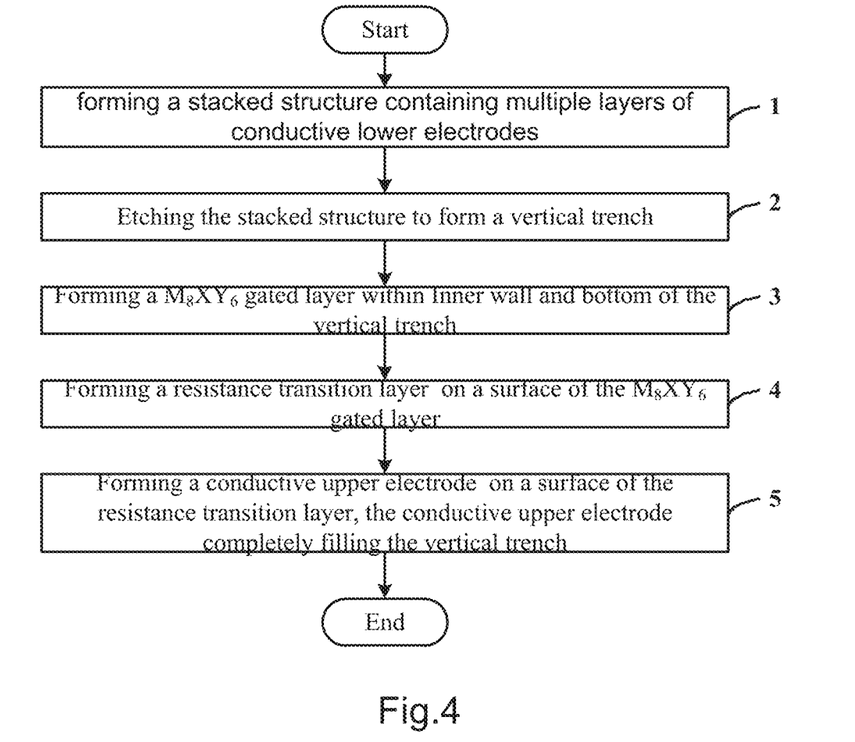
FIG. 4 is a flowchart of a method of manufacturing a self-gated RRAM cell according to an embodiment of the present disclosure.

Based on the self-gated RRAM cell of the above embodiment of the present disclosure, an embodiment of the present disclosure further provides a manufacturing method of a self-gated RRAM cell. As shown in FIG. 4, the method comprises steps 10 to 50.

In step 10, a stacked structure containing multiple layers of conductive lower electrodes is formed.

In this step, an insulating dielectric layer is firstly formed on a substrate; then a conductive lower electrode is formed on the insulating dielectric layer; next, another insulating dielectric layer is formed on the conductive lower electrode; then another conductive lower electrode is formed on the other insulating dielectric layer, and so on, so that the insulating dielectric layers and the conductive lower electrodes are formed alternately, and the stacked structure containing the multiple layers of the conductive lower electrodes is finally formed after an insulating dielectric layer is formed on a top layer of conductive lower electrode.

The conductive lower electrode may be formed by electron beam evaporation, chemical vapor deposition, pulse laser deposition, atomic layer deposition, or deposition by magnetron sputtering; and the insulating dielectric layer may be formed by chemical vapor deposition or sputtering.

In step 20, the stacked structure is etched to form a vertical trench.

In this step, etching, the stacked structure is etched, using a photolithograph and etching method, through the insulating dielectric layer covering the multiple layers of conductive lower electrodes, the multiple layers of conductive lower electrodes, and the insulating dielectric layers sandwiched between the multiple layers of conductive lower electrodes, the etching being stopped in the insulating dielectric layer under a bottom layer of conductive lower electrode. The photolithograph is conventional photolithograph, electron beam exposure, or nanoimprint; and the etching is dry etching or wet etching, which uses a single-step etching process to form the trench in one step, or uses a multi-step etching process to etch the insulating dielectric layers and the conductive lower electrodes separately.

In step 30, a M$_8$XY$_6$ gated layer is formed on an inner wall and a bottom of the vertical trench.

In this step, the M$_8$XY$_6$ gated layer is formed by electron beam evaporation, chemical vapor deposition, pulse laser deposition, atomic layer deposition, or deposition by magnetron sputtering.

In step 40, a resistance transition layer is formed on a surface of the M$_8$XY$_6$ gated layer.

In this step, the resistance transition layer is formed by electron beam evaporation, chemical vapor deposition, pulse laser deposition, atomic layer deposition, spin coating, or deposition by magnetron sputtering.

In step 50, a conductive upper electrode is formed on a surface of the resistance transition layer, and the vertical trench is filled with the conductive upper electrode.

In this step, the conductive upper electrode is formed within the vertical trench whose inner wall is covered by the M$_8$XY$_6$ gated layer and the resistance transition layer, by electron beam evaporation, chemical vapor deposition, pulse laser deposition, atomic layer deposition, or deposition by magnetron sputtering.

The step of forming the conductive upper electrode on the surface of the resistance transition layer further comprises: planarizing the conductive upper electrode, the resistance transition layer and the M$_8$XY$_6$ gated layer to form bit lines of the vertical cross array structure, thereby forming the self-gated RRAM cell. The step of planarizing comprises: performing a planarization process on the conductive upper electrode, the resistance transition layer and the M$_8$XY$_6$ gated layer by a chemical mechanical polishing method, completely removing materials of horizontal parts of the conductive upper electrode, the resistance transition layer and the $M_8XY_6$ gated layer to complete patterning of the bit lines.

As a preferred embodiment, a manufacturing process of a self-gated RRAM cell according to the present disclosure will be described in detail with reference to FIGS. 5 to 9. The process particularly comprises steps 1 to 5.

Figure 5:
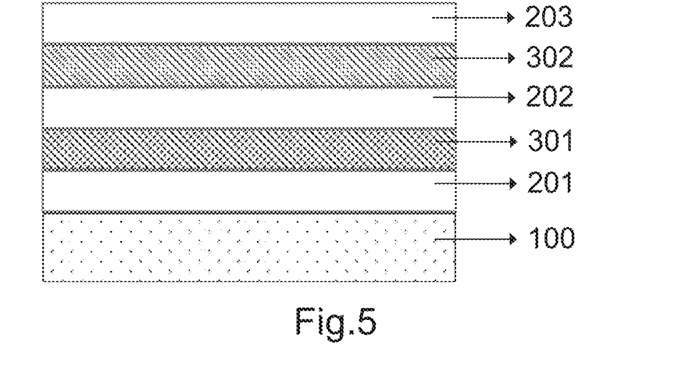
FIGS. 5 to 9 are process schematic diagrams of manufacturing a self-gated RRAM cell according to an embodiment of the present disclosure.

In step 1 multiple layers of patterned conductive lower electrodes are deposited.

As shown in FIG. 5, a stacked structure with multiple layers of conductive lower electrodes is formed on a Si substrate 100, the conductive lower electrodes being used as word lines in the vertical cross array structure and being isolated by the insulating dielectric sandwiched therebetween. As a preferred scheme, the present embodiment uses a stacked structure with two layers of conductive lower electrodes, i.e., a stacked structure consisting of a first conductive lower electrode 301 and a second conductive lower electrode 302. However, the number of the stacked layers is not limited by the present embodiment.

As shown in FIG. 5, the first conductive lower electrode 301 is isolated from the substrate 100 by a first insulating dielectric layer 201, the first conductive lower electrode 301 is isolated from the second conductive lower electrode 302 by a second insulating dielectric layer 202, and the second conductive lower electrode 302 is covered by a third insulating dielectric layer 203, wherein the first conductive lower electrode 301 and the second conductive lower electrode 302 may be formed by chemical electroplating or sputtering. As a preferred scheme, the first conductive lower electrode 301 and the second conductive lower electrode 302 in the present embodiment are made of metal W, and formed with a thickness of 5 nm-100 nm by sputtering.

The first to third insulating dielectric layers 201, 202 and 203 may be formed by chemical vapor deposition or sputtering, and may be made of SiN, SiO, SiON, $SiO_2$ doped with C, $SiO_2$ doped with P or $SiO_2$ doped with F. As a preferred scheme, the first to third insulating dielectric layers 201, 202 and 203 in the present embodiment may be made of $SiO_2$ and formed with a thickness of 10 nm-100 nm by chemical vapor deposition.

Figure 6:
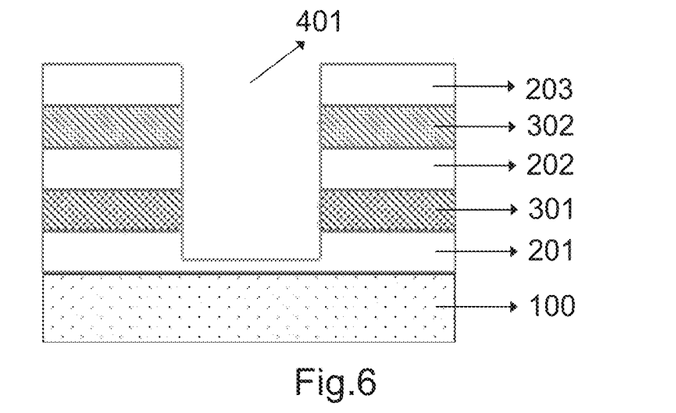

In step 2, a vertical trench is formed by etching.

As shown in FIG. 6, the third insulating dielectric layer 203, the second conductive lower electrode 302, the second insulating dielectric layer 202, the first conductive lower electrode 301 and the first insulating dielectric layer 201 are etched by a photolithograph and etching method, wherein the first conductive lower electrode 301 is etched through and the first insulating dielectric layer 201 is not etched through, so as to form the vertical trench 401. In this step, the photolithograph may be a pattern transfer technology, such as conventional photolithograph, electron beam exposure, nanoimprint etc.; and the etching may be dry etching or wet etching. Since the etching is performed on a plurality of thin films, a single-step etching process may be used to form the trench in one step, or a multi-step etching process may be used to etch the insulating dielectric layers and the conductive lower electrodes separately.

Figure 7:
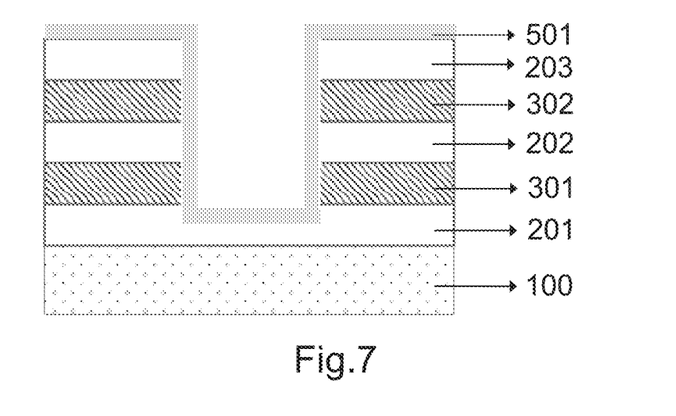

In step 3, a $M_8XY_6$ gated layer 501 is formed within the vertical trench.

As shown in FIG. 7, as a preferred embodiment, the $M_8XY_6$ gated layer 501 may be made of $Cu_8GeS_6$ or $Ag_8GeS_6$, and may be formed with a thickness of 5 nm-200 nm by deposition using a single target sputtering or a multi-target sputtering method.

Figure 8:
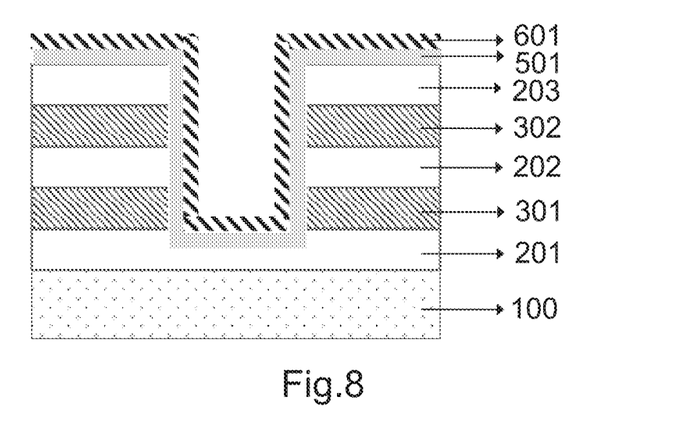

In step 4, a resistance transition layer 601 is deposited on the $M_8XY_6$ gated layer 501 within the vertical trench 401.

As shown in FIG. 8, as a preferred embodiment, the resistance transition layer 601 may be made of GeS or $HfO_2$, and may be prepared with a thickness of 1 nm-30 nm by sputtering or atomic chemical vapor deposition.

Figure 9:
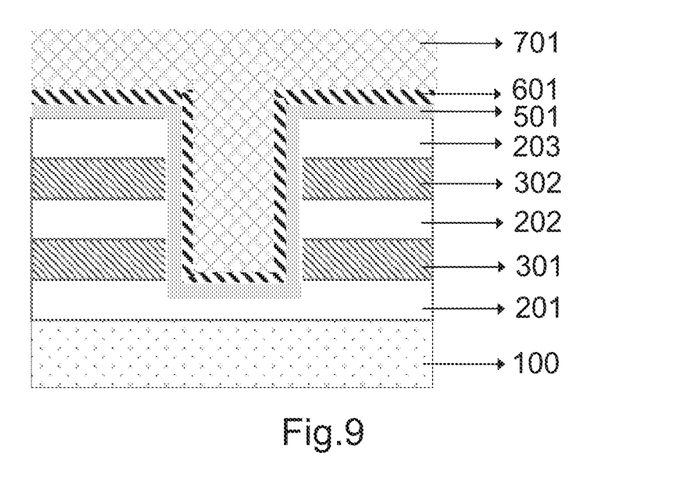

In step 5, a conductive upper electrode 701 is formed on the resistance transition layer 601 of the vertical trench 401.

As shown in FIG. 9, as a preferred embodiment, the conductive upper electrode 701 may be a multi-layer composite electrode made of one or more of Ti, TiN, Ta, TaN, Ru or Cu, and may be prepared with a thickness of 10 nm-1000 nm by sputtering, atomic chemical vapor deposition or electroplating.

In step 6, the conductive upper electrode 701, the resistance transition layer 601 and the $M_8XY_6$ gated layer 501 are planarized to form bit lines of the vertical cross array structure, i.e., forming the self-gated RRAM cell.

A planarization process may be performed on the conductive upper electrode 701, the resistance transition layer 601 and the $M_8XY_6$ gated layer 501 by chemical mechanical polishing, completely removing materials of horizontal parts of the conductive upper electrode 701, the resistance transition layer 601 and the $M_8XY_6$ gated layer 501 to complete patterning of the bit lines, which are particularly shown in FIG. 3.

Here, the manufacture of the self-gated RRAM unit with the self-gated function, as shown in FIG. 3, has been completed.

It may be understood that the above implementations are only exemplary implementations for illustrating the principles of the present disclosure, but the present disclosure is not limited to these. For the skilled in the art, various variations and improvements may be made without being apart from the sprit and substance of the present disclosure, which also fall into the protection scope of the present disclosure.

We claim:

1. A self-gated Resistive Random Access Memory (RRAM) cell, comprising:
   a substrate;
   a stacked structure on the substrate containing multiple layers of conductive lower electrodes, a first insulating dielectric layer, a second insulating dielectric layer, and a third insulating dielectric layer, wherein the first insulating dielectric layer is directly on the substrate;
   a vertical trench formed through the stacked structure, wherein a bottom of the vertical trench is formed within the first insulating dielectric layer;
   a $M_8XY_6$ gated layer formed on an inner wall and a bottom of the vertical trench, whose resistance shows a highly non-linear characteristic varied with voltage, wherein the $M_8XY_6$ gated layer is isolated from the substrate by the first insulating dielectric layer;
   a resistance transition layer formed on a surface of the $M_8XY_6$ gated layer, wherein the $M_8XY_6$ gated layer and the resistance transition layer are directly adjacent to each other without a conductive layer therebetween; and
   a conductive upper electrode formed on a surface of the resistance transition layer, the vertical trench being filled with the conductive upper electrode.

2. The self-gated RRAMV cell according to claim 1, wherein in the stacked structure containing the multiple layers of conductive lower electrodes, the multiple layers of conductive lower electrodes are used as word lines in a vertical cross array structure, any two layers of the multiple layers of conductive lower electrodes being isolated by the second insulating dielectric layer, a top layer of the multiple layers of conductive lower electrodes being covered by the third insulating dielectric layer, and a bottom layer of the multiple layers of conductive lower electrodes being isolated from the substrate by the first insulating dielectric layer.

3. The self-gated RRAM cell according to claim 2, wherein
the conductive lower electrodes are made of any of conductive materials selected from a group constituted of metal material W, Al, Cu, Au, Ag, Pt, Ru, Ti, Ta, Pb, Co, Mo, Ir or Ni and metal compound TiN, TaN, $IrO_2$, CuTe, $Cu_3Ge$, ITO or IZO, or are made of alloy of any two or more conductive materials selected from a group constituted of metal material W, Al, Cu, Au, Ag, Pt, Ru, Ti, Ta, Pb, Co, Mo, Ir or Ni and metal compound TiN, TaN, $IrO_2$, CuTe, $Cu_3Ge$, ITO or IZO; and
the conductive lower electrodes are formed with a thickness of 1 nm-500 nm by electron beam evaporation, chemical vapor deposition, pulse laser deposition, atomic layer deposition, or deposition by magnetron sputtering.

4. The self-gated RRAMV cell according to claim 2, wherein the first insulating dielectric layer is made of SiN, SiO, SiON, $SiO_2$ doped with C, $SiO_2$ doped with P or $SiO_2$ doped with F; and
the first insulating dielectric layer is formed with a thickness of 10 nm-100 nm by chemical vapor deposition or sputtering.

5. The self-gated RRAMV cell according to claim 2, wherein the stacked structure is constituted by two layers of the multiple layers of conductive lower electrodes which are a first conductive lower electrode and a second conductive lower electrode, the second conductive lower electrode being formed on the first conductive lower electrode, and the first conductive lower electrode being isolated from the second conductive lower electrode by the second insulating dielectric layer, the second conductive lower electrode being covered by the third insulating dielectric layer, and the first conductive lower electrode being isolated from the substrate by the first insulating dielectric layer.

6. The self-gated RRAMV cell according to claim 2, wherein the vertical trench goes through the third insulating dielectric layer covering the multiple layers of conductive lower electrodes, the multiple layers of conductive lower electrodes and the first second and third insulating dielectric layers sandwiched between the multiple layers of conductive lower electrodes sequentially, and the bottom of the vertical trench is formed within the first insulating dielectric layer under the bottom layer of the multiple layers of conductive lower electrodes.

7. The self-gated RRAM cell according to claim 1, wherein
for the $M_8XY_6$ gated layer formed on the inner wall and the bottom of the vertical trench, M is any of Cu, Ag, Li, Ni or Zn, X is any of Ge, Si, Sn, C or N, and Y is any of Se, S, O or Te.

8. The self-gated RRAM cell according to claim 7, wherein
the $M_8XY_6$ gated layer formed on the inner wall and the bottom of the vertical trench is further made of doped $M_8XY_6$ material, doping element(s) being one or more of N, P, Zn, Cu, Ag, Li, Ni, Zn, Ge, Si, Sn, C, N, Se, S, O, Te, Br, Cl, F or I.

9. The self-gated RRAM cell according to claim 1, wherein
the $M_8XY_6$ gated layer formed on the inner wall and the bottom of the vertical trench is formed with a thickness of 1 nm-500 nm by electron beam evaporation, chemical vapor deposition, pulse laser deposition, atomic layer deposition, or deposition by magnetron sputtering.

10. The self-gated RRAM cell according to claim 1, wherein
the resistance transition layer formed on the surface of the $M_8XY_6$ gated layer is made of any of inorganic material CuS, AgS, AgGeSe, $CuI_xS_y$, $ZrO_2$, $HfO_2$, $TiO_2$, $SiO_2$, $WO_x$, NiO, $CuO_x$, ZnO, $TaO_x$, CoO, $Y_2O_3$, Si, PCMO, SZO or STO, or is made of any of organic material TCNQ, PEDOT, $P_3HT$ or PCTBT, or is made of a material formed by the inorganic material or the organic material being doped and characteristic modified; and
the resistance transition layer is formed with a thickness of 1 nm-500 nm by electron beam evaporation, chemical vapor deposition, pulse laser deposition, atomic layer deposition, spin coating, or deposition by magnetron sputtering.

11. The self-gated RLRAMIV cell according to claim 1, wherein the conductive upper electrode formed within the vertical trench whose inner wall is covered by the $M_8XY_6$ gated layer and the resistance transition layer, and an upper surface of the conductive upper electrode is flushed with an upper surface of the third insulating dielectric layer covering a top layer of the multiple layers of conductive lower electrodes.

12. The self-gated RRAM cell according to claim 11, wherein
the conductive upper electrode is made of any of conductive materials selected from metal material W, Al, Cu, Au, Ag, Pt, Ru, Ti, Ta, Pb, Co, Mo, Ir or Ni and metal compound TiN, TaN, $IrO_2$, CuTe, $Cu_3Ge$, ITO or IZO, or is alloy made of any two or more conductive materials selected from metal material W, Al, Cu, Au, Ag, Pt, Ru, Ti, Ta, Pb, Co, Mo, Ir or Ni and metal compound TiN, TaN, $IrO_2$, CuTe, $Cu_3Ge$, ITO or IZO; and
the conductive upper electrode is formed with a thickness of 1 nm-500 nm by electron beam evaporation, chemical vapor deposition, pulse laser deposition, atomic layer deposition, or deposition by magnetron sputtering.

* * * * *